(12) United States Patent
Setsompop et al.

(10) Patent No.: US 8,405,395 B2
(45) Date of Patent: Mar. 26, 2013

(54) METHOD FOR SIMULTANEOUS MULTI-SLICE MAGNETIC RESONANCE IMAGING

(75) Inventors: Kawin Setsompop, Cambridge, MA (US); Lawrence L. Wald, Cambridge, MA (US)

(73) Assignee: The General Hospital Corporation, Boston, MA (US)

(*) Notice: Subject to any disclaimer, the term of this patent is extended or adjusted under 35 U.S.C. 154(b) by 496 days.

(21) Appl. No.: 12/761,314

(22) Filed: Apr. 15, 2010

(65) Prior Publication Data

US 2011/0254548 A1      Oct. 20, 2011

(51) Int. Cl.
*G01V 3/00* (2006.01)
(52) U.S. Cl. .................. 324/309; 324/318
(58) Field of Classification Search .......... 324/300–322; 600/407–445
See application file for complete search history.

(56) References Cited

U.S. PATENT DOCUMENTS

| | | | | |
|---|---|---|---|---|
| 4,665,367 | A * | 5/1987 | Kramer et al. | 324/309 |
| 5,323,110 | A * | 6/1994 | Fielden et al. | 324/309 |
| 5,508,612 | A * | 4/1996 | Kanazawa | 324/309 |
| 6,366,092 | B1 | 4/2002 | Ehnholm et al. | |
| 6,614,225 | B1 * | 9/2003 | Feinberg | 324/307 |
| 6,777,934 | B2 * | 8/2004 | Takahashi et al. | 324/309 |
| 2011/0286646 | A1 * | 11/2011 | Chen et al. | 382/131 |
| 2012/0235684 | A1 * | 9/2012 | Stemmer | 324/309 |

OTHER PUBLICATIONS

Breuer, et al., Controlled Aliasing in Parallel Imaging Results in Higher Acceleration (CAIPIRINHA) for Multi-Slice Imaging, Magnetic Resonance in Medicine 53:684-691, 2005.
Breuer, et al., Controlled Aliasing in Volumetric Parallel Imaging (2D CAIPIRINHA), Magnetic Resonance in Medicine 55:549-556, 2006.
Larkman, et al., Use of Multicoil Arrays for Separation of Signal from Multiple Slices Simultaneously Excited, Journal of Magnetic Resonance Imaging 13:313-317, 2001.
Moeller, et al., fMRI with 16 Fold Reduction Using Multibanded Multislice Sampling, Proc. Intl. Soc. Mag. Reson. Med. 16:2366, 2008.

(Continued)

*Primary Examiner* — Brij Shrivastav
(74) *Attorney, Agent, or Firm* — Quarles & Brady, LLP

(57) ABSTRACT

A method for multi-slice magnetic resonance imaging, in which image data is acquired simultaneously from multiple slice locations using a radio frequency coil array, is provided. By way of example, a modified EPI pulse sequence is provided, and includes a series of magnetic gradient field "blips" that are applied along a slice-encoding direction contemporaneously with phase-encoding blips common to EPI sequences. The slice-encoding blips are designed such that phase accruals along the phase-encoding direction are substantially mitigated, while providing that signal information for each sequentially adjacent slice location is cumulatively shifted by a percentage of the imaging FOV. This percentage FOV shift in the image domain provides for more reliable separation of the aliased signal information using parallel image reconstruction methods such as SENSE. In addition, the mitigation of phase accruals in the phase-encoding direction provides for the substantial suppression of pixel tilt and blurring in the reconstructed images.

20 Claims, 8 Drawing Sheets

OTHER PUBLICATIONS

Moeller, et al., Unaliasing of Multiband Multislice EPI and GRE Imaging with GRAPPA, Proc. Intl. Soc. Mag. Reson., Med. 17:1544, 2009.

Nunes, et al., Simultaneous Slice Excitation and Reconstruction for Single Shot EPI, Proc. Intl. Soc. Mag. Reson. Med. 14:293, 2006.

Pruessmann, et al., SENSE: Sensitivity Encoding for Fast MRI, Magnetic Resonance in Medicine 42:952-962, 1999.

Reese, et al., Halving Imaging Time of Whole Brain Diffusion Spectrum Imaging and Diffusion Tractography Using Simultaneous Image Refocusing in EPI, Journal of Magnetic Resonance Imaging 29:517-522, 2009.

Robson, et al., Comprehensive Quantification of Signal-to-Noise Ratio and g-Factor for Image-Based and k-Space-Based Parallel Imaging Reconstructions, Magnetic Resonance in Medicine 60(4):895-907, 2008.

Weaver, Simultaneous Multislice Acquisition of MR Images, Magnetic Resonance in Medicine 8:275-284, 1988.

Wu, et al., Wideband MRI: A New Dimension of MR Image Acceleration, Proc. Intl. Soc. Mag. Reson. Med. 17:2678, 2009.

* cited by examiner

METHOD FOR SIMULTANEOUS MULTI-SLICE MAGNETIC RESONANCE IMAGING

STATEMENT REGARDING FEDERALLY SPONSORED RESEARCH

This invention was made with United States government support awarded by the following agency: National Institutes of Health NIH RR1475. The United States government has certain rights in this invention.

BACKGROUND OF THE INVENTION

The field of the invention is methods and systems for magnetic resonance imaging. More particularly, the invention relates to methods and systems for parallel magnetic resonance imaging, in which k-space data is acquired from multiple slice locations substantially contemporaneously.

Magnetic resonance imaging ("MRI") uses the nuclear magnetic resonance ("NMR") phenomenon to produce images. When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Depending on the technique used, many MR scans currently require many minutes to acquire the necessary data used to produce medical images. The reduction of this scan time is an important consideration, since reduced scan time increases patient throughput, improves patient comfort, and improves image quality by reducing motion artifacts. Many different strategies have been developed to shorten the scan time.

One such strategy is referred to generally as "parallel MRI" ("pMRI"). Parallel MRI techniques use spatial information from arrays of radio frequency ("RF") receiver coils to substitute for the spatial encoding that would otherwise have to be obtained in a sequential fashion using RF pulses and magnetic field gradients, such as phase and frequency encoding gradients. Each of the spatially independent receiver coils of the array carries certain spatial information and has a different spatial sensitivity profile. This information is utilized in order to achieve a complete spatial encoding of the received MR signals, for example, by combining the simultaneously acquired data received from each of the separate coils. Parallel MRI techniques allow an undersampling of k-space by reducing the number of acquired phase-encoded k-space sampling lines, while keeping the maximal extent covered in k-space fixed. The combination of the separate MR signals produced by the separate receiver coils enables a reduction of the acquisition time required for an image, in comparison to a conventional k-space data acquisition, by a factor related to the number of the receiver coils. Thus the use of multiple receiver coils acts to multiply imaging speed, without increasing gradient switching rates or RF power.

Two categories of such parallel imaging techniques that have been developed and applied to in vivo imaging are so-called "image space methods" and "k-space methods." An exemplary image space method is known in the art as sensitivity encoding ("SENSE"), while an exemplary k-space method is known in the art as simultaneous acquisition of spatial harmonics ("SMASH"). With SENSE, the undersampled k-space data is first Fourier transformed to produce an aliased image from each coil, and then the aliased image signals are unfolded by a linear transformation of the superimposed pixel values. With SMASH, the omitted k-space lines are synthesized or reconstructed prior to Fourier transformation, by constructing a weighted combination of neighboring k-space lines acquired by the different receiver coils. SMASH requires that the spatial sensitivity of the coils be determined, and one way to do so is by "autocalibration" that entails the use of variable density k-space sampling.

A more recent advance to SMASH techniques using autocalibration is a technique known as generalized autocalibrating partially parallel acquisitions ("GRAPPA"), as described, for example, in U.S. Pat No. 6,841,998. With GRAPPA, k-space lines near the center of k-space are sampled at the Nyquist frequency, in comparison to the undersampling employed in the peripheral regions of k-space. These center k-space lines are referred to as the so-called autocalibration signal ("ACS") lines, which are used to determine the weighting factors that are utilized to synthesize, or reconstruct, the missing k-space lines. In particular, a linear combination of individual coil data is used to create the missing lines of k-space. The coefficients for the combination are determined by fitting the acquired data to the more highly sampled data near the center of k-space.

Nerve tissue in human beings, and other mammals, includes neurons with elongated axonal portions arranged to form neural fibers, or fiber bundles, along which electrochemical signals are transmitted. In the brain, for example, functional areas defined by very high neural densities are typically linked by structurally complex neural networks of axonal fiber bundles. The axonal fiber bundles and other fibrous material are substantially surrounded by other tissue.

Diagnosis of neural diseases, planning for brain surgery, and other neurologically related clinical activities as well as research activities on brain functioning can benefit from non-invasive imaging and tracking of the axonal fibers and fiber bundles. In particular, diffusion tensor imaging ("DTI") has been shown to provide image contrast that correlates with axonal fiber bundles. In the DTI technique, motion sensitizing magnetic field gradients are applied in a so-called diffusion weighted imaging ("DWI") pulse sequence so that images, having contrast related to the diffusion of water or other fluid molecules, are obtained. By applying the diffusion gradients in selected directions during the MRI measurement cycle, diffusion weighted images are acquired, from which apparent diffusion tensor coefficients are calculated for each voxel location in the reconstructed images. Since fluid molecules diffuse more readily along the direction of axonal fiber bundles as compared with directions partially or totally orthogonal to the fibers, the directionality and anisotropy of the apparent diffusion coefficients tend to correlate with the direction of the axonal fibers and fiber bundles. Using iterative tracking methods, axonal fibers or fiber bundles can be tracked or segmented using the DTI data.

In order to calculate the apparent diffusion tensor coefficients, however, it is necessary to acquire at least six DWI images using motion-sensitizing gradients directed in six different directions. Indeed, it is desirable to acquire more than six directions, but the acquisition of additional DWI images extends the total scan time beyond what is already a lengthy scan.

In modern diffusion methods such as Q-ball imaging ("QBI"), high angular resolution diffusion imaging ("HARDI"), and diffusion spectrum imaging ("DSI"), an echo planar imaging ("EPI") pulse sequence is commonly employed for directing the MRI system to acquire diffusion weighted image data. Moreover, the pulse sequence must be repeated up to hundreds of times in order to encode the high angular resolution diffusion information needed, for example, to characterize the fiber bundles in white matter. As a result, these methods are limited by imaging time. For example, a QBI or HARDI acquisition of image data from 64 different slice locations, covering the whole head, and that utilizes 128 different diffusion encoding directions, would require 8,192 repetitions of the EPI sequence. For a standard diffusion protocol, the EPI acquisition for each slice takes about 100 milliseconds ("ms"). Thus, the total acquisition time for the aforementioned imaging session is close to fourteen minutes, which is clinically unacceptable. It would therefore be desirable to provide a method for decreasing the amount of time necessary to acquire the large number of diffusion weighted image data sets demanded by modern diffusion methods.

High spatial resolution functional magnetic resonance imaging ("fMRI") acquisition methods commonly utilize EPI sequences and, thus, suffer a similar problem. For example, whole-head coverage at high resolution requires as many as 128 slices for 1 mm isotropic image voxels. Since a single slice can be acquired in about 80 ms for fMRI, the temporal resolution for the time series is 128 times 80 ms, which is around 10 seconds. This temporal resolution is often too slow for many functional paradigms, especially event-related paradigms. It would therefore also be desirable to provide a method for increasing the temporal resolution of fMRI acquisitions, including high spatial resolution fMRI acquisitions.

Conventional parallel MRI techniques rely on accelerating standard image acquisitions by undersampling k-space. For example, these methods undersample k-space by reducing the number of phase-encodings acquired during each repetition of a pulse sequence. Data acquisition schemes such as EPI, however, are not sped up significantly by conventional parallel imaging techniques. For example, an EPI sequence is typically only sped up by around 20 percent when using parallel imaging techniques, whereas conventional imaging sequences are sped up by around 200-300 percent. Although k-space can be undersampled in the phase encode direction in EPI acquisitions, the number of slices that can be obtained per second is not significantly increased in this manner. For example, a diffusion acquisition with EPI uses only a relatively small fraction of the acquisition time reading out k-space, while the rest of the time is used for RF excitation and diffusion encoding. Thus, while SENSE and GRAPPA have benefits for reducing image distortion in EPI, they do not significantly speed up a lengthy diffusion acquisition. For this reason, another approach for decreasing the acquisition time required of EPI pulse sequences is desired.

Recently, other methods for decreasing scan time have been developed. For example, methods for the simultaneous acquisition of image data from multiple imaging slice locations, using an array of multiple radio frequency ("RF") receiver coils, and subsequent separation of the superimposed slices during image reconstruction have be introduced, as described by D. J. Larkman, et al., in "Use of Multicoil Arrays for Separation of Signal from Multiple Slices Simultaneously Excited," *Journal of Magnetic Resonance Imaging*, 2001; 13(2):313-317. This method is limited, however, in that the separation of the multiple slices is rendered difficult by the close spatial proximity of the aliased pixels that must be separated during image reconstruction. For example, if image data is acquired from three slices simultaneously, and with an inter-slice spacing of around 3 cm, then aliasing will be present along the slice-encoding direction, and this aliasing must be undone in order to produce reliable images. The origin of the aliased pixels are only 3 cm apart in space, and it is this spatial closeness of the aliased pixels that makes their separation difficult by standard parallel imaging methods, such as sensitivity encoding ("SENSE").

The failure of SENSE, and other similar methods, to properly separate the aliased pixels results from the differences in detection strength among the multiple array coil elements at the locations of the aliased pixels. In particular, the problem is that the detection profiles of the coil array elements are not unique enough on the spatial scale of a few centimeters. As a result, a high level of noise amplification, characterized by a high SENSE g-factor, is present in the separated images. This result is in contrast to the conventional implementation of SENSE methods, in which an undersampled phase encoding scheme produces aliasing along the phase-encoding direction, which is orthogonal to the slice-encoding direction. Moreover, this in-plane aliasing results in pairs of aliased pixels that are separated by one-half of the image field-of-view ("FOV"). For a conventional brain image, the FOV is equal to around 24 cm; thus, when aliasing occurs in the imaging plane, or slice, the distance between aliased pixels is around 12 cm. It is contemplated that it is the four-fold smaller distance between aliased pairs of pixels that results in significant noise amplification in the method disclosed by Larkman. It would therefore be desirable to provide a method for simultaneous multi-slice imaging that is produces less noise amplification than presently available methods, such as the one taught by Larkman.

Recently, the Larkman method has been improved upon for conventional image acquisition techniques, as described, for example by F. A. Breuer, et al., in "Controlled Aliasing in Parallel Imaging Results in Higher Acceleration (CAIPIRINHA) for Multi-Slice Imaging," *Magn. Reson. Med.,* 2005; 53(3):684-691. This method, referred to as "CAIPIRINHA," increases the distance between aliased pixels by introducing a one-half FOV shift in the images of every other slice. This shift is achieved by modulating the phase of the RF excitation pulse used to acquire every other line of k-space by 180 degrees. In this manner, when the image slices superimpose, every-other slice is shifted by one-half of the FOV. Thus, aliased pixels are separated by one-half the FOV in the phase-encoding direction, and are separated, for example, by the 3 cm distance between the slices in slice-encoding direction. This added separation in the phase-encoding direction improves the ability of parallel image reconstruction methods, such as SENSE, to unalias the slices without producing artifacts or significant noise amplification. In addition, the one-half FOV shift also has the benefit that the method does not completely rely on the distribution in coil sensitivity modulation in the slice-encoding direction. As noted above, RF coil array elements typically do not have significant modulation in their sensitivity patterns along, for example, the z-direction, which corresponds to a slice-encoding direction for the commonly acquired axial, or transverse, images.

The CAIPIRINHA method still presents problems, however. For example, the one-half FOV shift imparted to every other slice is achieved by modulating the phase of the RF excitation pulses of every other line in k-space. While this is applicable to conventional acquisitions, in which every line of k-space is acquired with a separate excitation, it is not applicable to EPI acquisitions, in which all the lines of k-space are acquired after a single RF excitation. Thus, the CAIPIRINHA method is not extendable to EPI acquisitions. It would therefore be desirable to provide a method for simultaneous multi-slice imaging that allows a more efficient separation of pixels that are aliased along the slice-encoding direction, but that is applicable to acquisition schemes such as EPI, in which multiple lines of k-space are sampled after each RF excitation pulse.

In addition to the Larkman and CAIPIRINHA methods, there are two other simultaneous multi-slice imaging methods worth noting. One of these methods is the so-called "wideband" method described, for example, by J. B. Weaver in "Simultaneous Multislice Acquisition of MR Images," *Magn. Reson. Med.,* 1988; 8(3):275-284. The wideband method relies on the application of a constant slice-selective magnetic field gradient during data acquisition. This gradient produces a frequency shift in each imaging slice, thereby shifting the readout bandwidth of any given slice out of the readout bandwidth of the other slices. Applying a slice-selective gradient during readout, however, is problematic. In order to achieve a sufficient frequency shift, the gradient must be strong enough to appreciably tilt the readout gradient direction relative to the phase-encoding and slice-encoding directions. The wideband method has the advantage that parallel imaging methods are not needed since the shift is in the frequency-encoding direction and is sufficient to separate the slices by their frequency. However, the resultant tilting produces trapezoidal pixels, in which the frequency shift is substantial enough to degrade the image resolution. For this latter reason, the wideband method has never found wide usage.

An attempt was made to improve the wideband method by implementing the methodology behind CAIPIRINHA, as described, for example, by R. G. Nunes, et al., in "Simultaneous Slice Excitation and Reconstruction for Single Shot EPI," *Proceedings of the* 14*th Annual Meeting of ISMRM*, Seattle, Wash., USA, 2006, 293. In the Nunes method, a shift of much less than a full FOV by the wideband approach is employed to improve the g-factor penalty in the SENSE based slice separation used by CAIPIRINHA. Nonetheless, a penalty in term of image pixel tilt still exists in the Nunes method. Despite this pixel tilt being smaller than in the wideband method, it is still significant enough to degrade image quality, particularly when the simultaneously excited slices are close in proximity.

The Nunes method adapts the wideband approach by utilizing slice-selective gradients "blips" that are a scaled version of the phase encoded gradients commonly found in EPI acquisitions. Since the slices exist at discrete spatial locations, the slice-selective gradient blips produce a phase ramp in the $k_y$-direction in k-space. This phase ramp is produced across the EPI readout, and is different for each of the excited slices. In this manner, each successively sampled $k_y$ line in k-space for a given slice receives a phase increment, $\Delta\phi$, equal to:

$$\Delta\phi = \gamma G_z z t \qquad \text{Eqn. (1);}$$

where $\gamma$ is the gyromagnetic ratio of the imaged species, $G_z$ is the amplitude of the slice-selective gradient blip, t is the duration of the slice-selective gradient blip, and z is the location of the given slice. Thus, the relative phase increment between even and odd slices is:

$$\Delta\phi = \gamma G_z \Delta z t \qquad \text{Eqn. (2);}$$

where $\Delta z$ is the inter-slice spacing, or slice separation. Therefore, in order to impart a one-half FOV shift in every other slice requires the relative phase increment between the $k_y$ lines to equal 180 degrees.

The problem with this approach of simultaneously applying slice-selective and phase-encoding gradient blips is that this approach results in a rotation of the phase-encoding direction such that it is no longer orthogonal to the slice-selective direction. This rotation results in the same "tilted pixel" problem found in the standard wideband method; however, now the tilting is occurring in the phase-encoding direction, and not the frequency-encoding direction. In this manner, the phase shifts imparted to the $k_y$ lines by the slice-selective gradient blips cause through-plane dephasing within each excited slice. While an initial pre-winding gradient can ensure that the amount of through-plane dephasing is zero at the center of k-space, the through-plane dephasing accumulates at the edges of k-space along the $k_y$-direction. As a result, the through-plane dephasing acts as a blurring filter in the phase-encoding direction of the image, similar to how the wideband method produces a blurring filter in the readout direction. As a result of this blurring, the Nunes method utilized only a 15 percent shift in the FOV, instead of the desired one-half FOV shift. Thus, the Nunes method requires a trade-off between the reduction in noise amplification and pixel tilt and blurring. It is noted that even with this limited FOV shift, a significant pixel tilt can result, particularly when more than two slices are excited simultaneously. As a result, the slice achievable separation is limited. It would therefore be desirable to provide a method for simultaneous multi-slice imaging that allows for a greater FOV shift than achievable with the Nunes method without introducing a significant amount of pixel blurring or noise amplification in the reconstructed images.

A second notable method for simultaneous multi-slice imaging was recently described by D. A. Feinberg, et al., in "Simultaneous Echo Refocusing in EPI," *Magn. Reson. Med.*, 2002; 48(1):1-5. In this method, which is termed "SER-EPI," the RF excitation of the slices is sequential, as opposed to truly simultaneous. A readout gradient pulse is applied between two sequential excitations, and acts to shift the k-space data of one slice relative to the other along the $k_x$-direction, which corresponds to the readout direction in image space. By lengthening the readout window, the k-space data for both slices is captured sequentially. The data can then be cut apart and reconstructed separately.

This approach has several downsides, however. Since the excitation is not simultaneous, the two slices do not have identical echo times ("TE"). In fact, the TEs typically differ by about 3 ms. This difference in TE is problematic, in that image intensity and contrast is exponentially dependent on TE. Thus, the two slices are not truly identical in image contrast or intensity. Another limitation of the SIR-EPI method is that the lengthened readout needed to capture the shifted k-space data of the second slice increases the total readout duration. In turn, this increased duration increases the $B_0$ susceptibility distortions included in the resultant EPI images. For example, these distortions are increased by a factor of about 1.6 for the simultaneous acquisition of two slices, and by more than a factor of two when three slices are simultaneously acquired. Moreover, for three slice acquisitions, the TE differences are also magnified.

CAIPIRHINA and other simultaneous multi-slice methods have not gained much traction in conventional imaging since there are alternative parallel imaging methods, such as conventional SENSE and GRAPPA, for accelerating standard image acquisitions. However, as noted above, these methods do not confer the same acceleration benefits on pulse sequences such as EPI as they do on other conventional pulse sequences. Unlike parallel imaging methods such as SENSE and GRAPPA, multi-slice acquisition techniques do not aim to shorten the time spent on reading out k-space data, for example, by reducing the number of phase-encodings. Rather, they aim to acquire signal data from multiple image slice locations per acquisition, such that the number of repetitions of a pulse sequence can be reduced to similarly reduce overall scan time. For example, a three-fold accelerated multi-slice acquisition acquires image data from three image slice locations per each repetition of the EPI sequence. As a result of this simultaneous acquisition, the number of repetitions of an EPI sequence required to cover an imaging volume is reduced, thereby similarly reducing the total acquisition time.

It would therefore be desirable to provide a method for simultaneous, multi-slice imaging that significantly decreases the amount of time required for acquiring image data; that is applicable to imaging pulse sequences that sample multiple lines of k-space following each RF excitation, such as EPI sequences; and that allows more reliable separation of aliased pixels than currently available methods for simultaneous multi-slice imaging, so that the benefits associated with these techniques can be realized in a clinical setting.

SUMMARY OF THE INVENTION

The present invention overcomes the aforementioned drawbacks by providing a method for simultaneous multi-slice magnetic resonance imaging ("MRI") that allows for more reliable separation of aliased pixels than currently available multi-slice MRI methods; the provided method achieves this separation by shifting the aliased pixels by a selected percentage of the imaging field-of-view ("FOV"). In general, the percentage of the FOV to shift the aliased pixels is selected such that the largest possible separation between the aliased pixels is achieved. This selection takes into consideration several factors including the number of slice locations simultaneously acquired, the separation distance of the slice locations, and the in-plane and longitudinal variation of the sensitivity of the RF coil employed to acquire the signal data. Moreover, this FOV shift is achieved while substantially mitigating pixel tilt and blurring, which are problems common to currently available methods. The provided method decreases the amount of time required to acquire the image data from multiple slice locations, and increases the signal-to-noise ratio ("SNR") achievable compared to currently available multi-slice MRI methods.

It is an aspect of the invention to provide a method for imaging techniques such as echo planar imaging ("EPI"), in which image data may be simultaneously acquired from multiple slice locations. The EPI pulse sequence employed when practicing the present invention includes a series of magnetic gradient field "blips" applied along the slice-encoding direction contemporaneously with the phase-encoding blips common to EPI sequences. Successive slice-encoding blips are different and designed such that phase accruals along the phase-encoding direction are substantially mitigated, while providing that signal information for every other slice location is shifted by a percentage of the imaging FOV, such as 50 or 33 percent. This percentage FOV shift in the image domain provides for more reliable separation of the aliased signal information. It should be apparent, however, that pulse sequences other than EPI that sample multiple lines of k-space following a single RF excitation can also be employed when practicing the present invention. For example, pulse sequences such as gradient and spin echo ("GRASE") pulse sequences and fast spin echo ("FSE")

pulse sequences, such as rapid acquisition with relaxation enhancement ("RARE") sequences.

It is another aspect of the invention to provide an imaging method, in which imaging speed and sensitivity are improved. While conventional two-dimensional EPI methods are fast (for example, a single slice can be acquired in around 100 milliseconds), it is inefficient and not fast enough for more advanced imaging applications, such as advanced diffusion weighted imaging techniques. In particular, the efficiency of conventional EPI methods is reduced by the two-dimensional slice-by-slice nature of the acquisition. For example, in a standard diffusion imaging tractography application, sixty-four slices are acquired to cover the spatial extent of a patient's head. In this example, the fraction of time the MRI system spends for acquiring each slice is one sixty-fourth of the total imaging time. The provided method improves the efficiency of EPI acquisitions by reducing this fraction by 2-6 fold. Multiple slices are excited simultaneously and reconstructed separately using information from the detector array system. Given successful separation of the simultaneously excited slices, the scan time for a given EPI acquisition is reduced by a factor of up to the number of slices simultaneous excited. This improvement in imaging speed is achieved with only a minor penalty in sensitivity; improving the efficiency of the encoding improves the sensitivity per unit time.

It is yet another aspect of the invention to provide a method for diffusion weighted imaging in which imaging time is significantly reduced and SNR is significantly increased. These benefits may be achieved using, for example, an EPI pulse sequence modified in the manner described above. As a result, diffusion weighted image data can be acquired for such modern diffusion imaging methods as Q-ball imaging ("QBI"), high angular resolution diffusion imaging ("HARDI"), and diffusion spectrum imaging ("DSI"), in clinically acceptable durations of time. It is contemplated that such decreased in required scan time will provide amenable clinical applications of modern diffusion imaging methods. For example, given the N-fold efficiency gain provided by simultaneously exciting and acquiring image data from N image slice location, scan time can be reduced by employing the desired number of diffusion encoding steps in less time than previously achievable. Similarly, the scan time can be kept the same, but the number of diffusion encoding steps increased. This increase in the number of achievable encoding steps allows more nuanced diffusion information to be obtained.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

The succeeding description is provided with reference to the following orthogonal spatial encoding directions common to magnetic resonance imaging ("MRI"): a slice-encoding direction, a phase-encoding direction, and a frequency-encoding direction. By way of example, as referred to herein, the slice-encoding direction corresponds to the z-direction in the image domain, which is aligned along the longitudinal axis of the bore of an exemplary MRI system, and the $k_z$-direction in k-space. In this manner, the obtained images are transverse, or axial, images lying in the x-y plane. Accordingly, as referred to herein, the phase-encoding direction corresponds to the y-direction in the image domain, and the $k_y$-direction in k-space; and the frequency-encoding direction corresponds to the x-direction in the image domain, and the $k_x$-direction in k-space. It will be appreciated by those skilled in the art that the choice of these directions is arbitrary and any suitable permutation of these directions, or any set of orthogonal oblique directions, is possible and within the scope of the present invention. The choice of these directions is typically made depending on the desired imaging application, such as whether it is desirable to acquire axial, sagittal, or coronal images of a subject.

Exemplary Magnetic Resonance Imaging System

Figure 1:
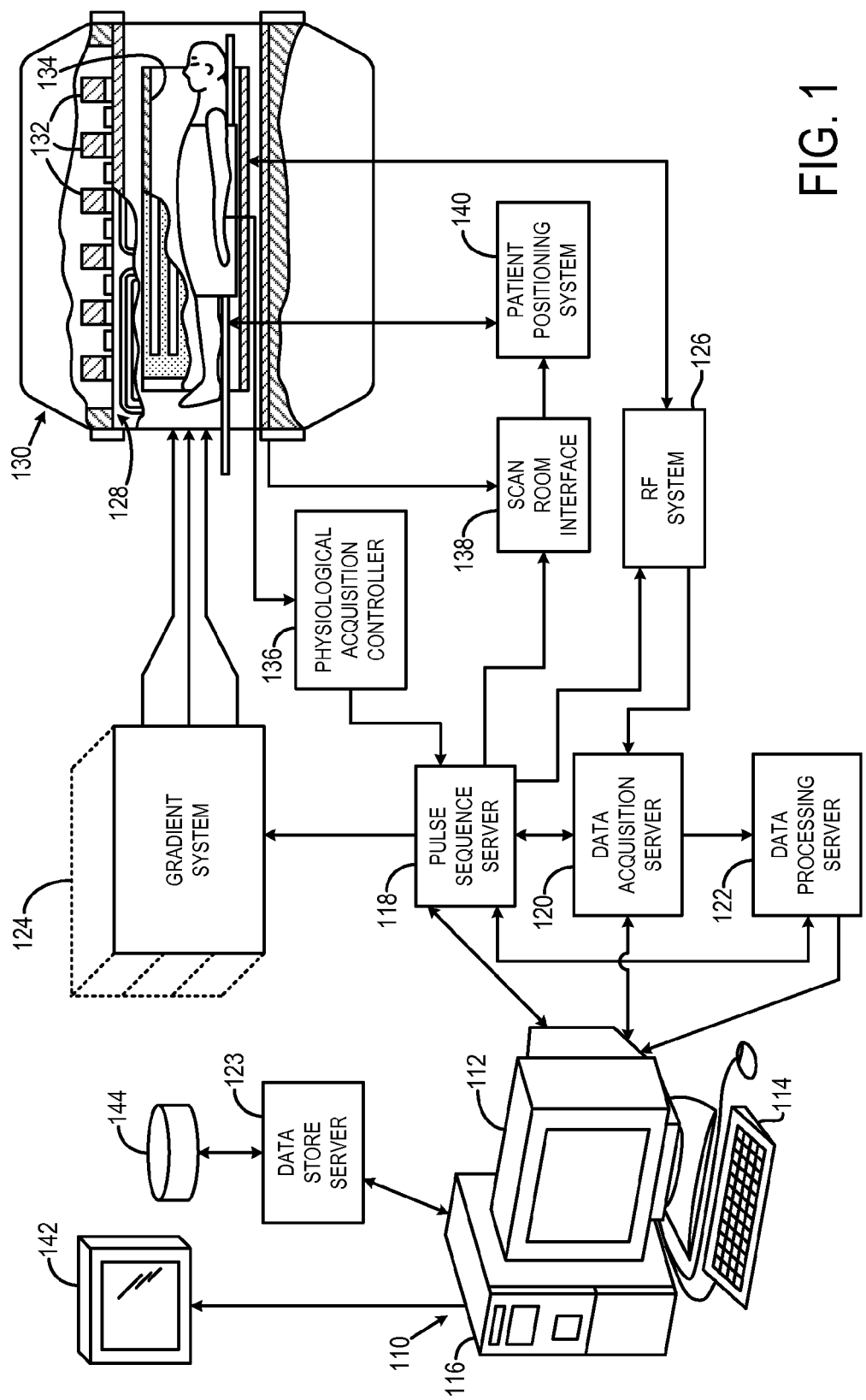
FIG. 1 is a block diagram of an exemplary magnetic resonance imaging ("MRI") system that employs the present invention.

Referring particularly to FIG. 1, the present invention is employed in an MRI system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and a radiofrequency ("RF") system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \qquad \text{Eqn. (3);}$$

and the phase of the received MR signal may also be determined:

$$\phi = \tan^{-1}\left(\frac{Q}{I}\right). \qquad \text{Eqn. (4)}$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate," the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; and the calculation of motion or flow images.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
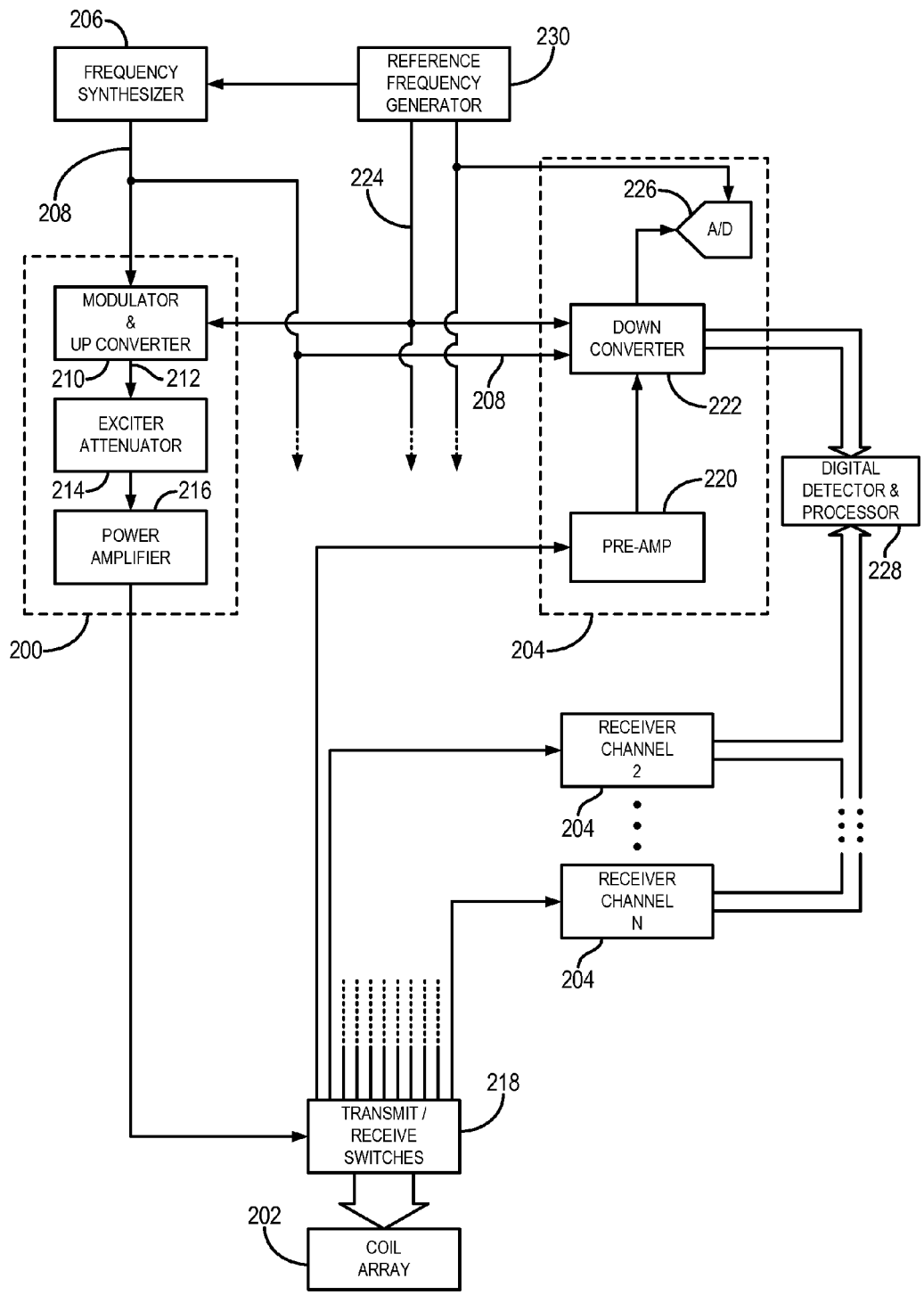
FIG. 2 is a block diagram of an exemplary radio frequency ("RF") system that forms part of the MRI system of FIG. 1.

As shown in FIG. 1, the radiofrequency ("RF") system 126 may be connected to the whole body RF coil 134, or as shown in FIG. 2, a transmitter section of the RF system 126 may connect to at least one transmit channel 200 of a coil array 202, and its receiver section may connect to at least one receiver channel 204 of the coil array 202. Often, the transmitter section is connected to the whole body RF coil 134 or a local transmit coil (not shown), and, in so-called "parallel receiver" coil arrays, each receiver section is connected to a separate receiver channel 204.

Referring particularly to FIG. 2, the RF system 126 includes a transmitter that produces a prescribed RF excitation field. The base, or carrier, frequency of this RF excitation field is produced under control of a frequency synthesizer 206 that receives a set of digital signals from the pulse sequence server 118. These digital signals indicate the frequency and phase of the RF carrier signal produced at an output 208. The RF carrier is applied to a modulator and up converter 210 where its amplitude is modulated in response to a signal, R(t), also received from the pulse sequence server 118. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 212 is attenuated by an exciter attenuator circuit 214 that receives a digital command from the pulse sequence server 118. The attenuated RF excitation pulses are applied to a power amplifier 216, which drives the RF coil array 202 through a transmit/receive ("T/R") switch 218.

Referring still to FIG. 2, the signal produced by the subject is picked up by the coil array 202 and applied to the inputs of a set of receiver channels 204. A pre-amplifier 220 in each receiver channel 204 amplifies the signal by an amount determined by a digital attenuation signal received from the pulse sequence server 118. The received signal is at or around the Larmor frequency, and this high frequency signal is down-converted in a two step process by a down converter 222, which first mixes the detected signal with the carrier signal on line 208 and then mixes the resulting difference signal with a reference signal on line 224. The down converted MR signal is applied to the input of an analog-to-digital ("A/D") converter 226 that samples and digitizes the analog signal and applies it to a digital detector and signal processor 228 that produces 16-bit in-phase (I) values and 16-bit quadrature (Q) values corresponding to the received signal. The resulting stream of digitized I and Q values of the received signal are output to the data acquisition server 120. The reference signal, as well as the sampling signal applied to the A/D converter 226, are produced by a reference frequency generator 230.

Gradient Recalled Echo Pulse Sequence with One-Half Field-Of-View Shift

Figure 3:
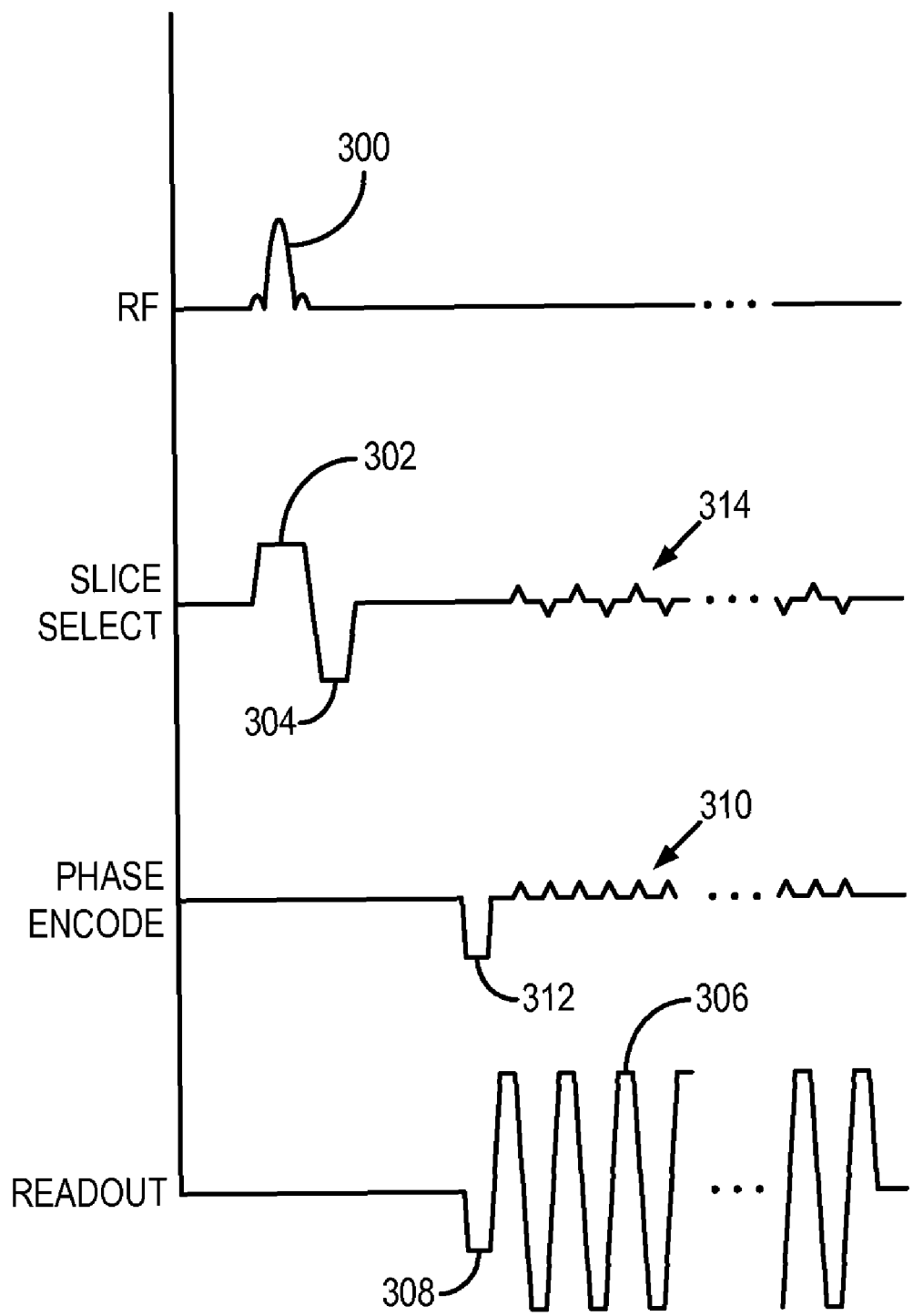
FIG. 3 is a graphic illustration of an exemplary gradient-recalled echo planar imaging ("EPI") pulse sequence for directing the MRI system of FIG. 1 to simultaneously acquire image data from multiple slice locations in a subject, such that a one-half field-of-view ("FOV") shift is imparted to MR signals acquired from slice locations adjacent a desired slice location.

An exemplary pulse sequence employed to direct the MRI system to acquire image data in accordance with the present invention is illustrated in FIG. 3. Such an exemplary pulse sequence is a gradient-recalled echo planar imaging ("EPI") pulse sequence that is modified to acquire image data from multiple slice locations simultaneously. The pulse sequence includes a spatially selective radio frequency ("RF") excitation pulse 300 that is played out in the presence of a slice-selective gradient 302 in order to produce transverse magnetization in a plurality of prescribed imaging slices. For example, three slice locations each separated by 4.2 centimeters ("cm") are selectively excited. The RF excitation pulse is the summation of RF excitation pulses that would be used to separately excite the desired plurality of slice locations and is applied with a flip angle, for example, of 70 degrees. The slice-selective gradient 302 includes a rephasing lobe 304 that acts to rephase unwanted phase dispersions introduced by the slice-selective gradient 302 such that signal losses resultant from these phase dispersions are mitigated.

Following excitation of the nuclear spins in the prescribed imaging slices, image data is acquired by sampling a series of gradient-recalled echo signals in the presence of an alternating readout gradient 306. The alternating readout gradient is preceded by the application of a pre-winding gradient 308 that acts to move the first sampling point along the frequency-encoding, or readout, direction by a distance $\Delta k_x$ in k-space. Spatial encoding of the echo signals along a phase-encoding direction is performed by a series of phase encoding gradient "blips" 310, which are each played out in between the successive signals readouts such that each echo signal is separately phase encoded. The phase encoding gradient blips 310 are preceded by the application of a pre-winding gradient 312 that acts to move the first sampling point along the phase-encoding direction a distance $\Delta k_y$ in k-space. Together, the pre-winding gradients 308 and 312 serve to begin the sampling of k-space at a defined k-space location $(k_x, k_y)$.

During the application of each phase encoding gradient blip 310, a magnetic field gradient blip is also played out along the slice-encoding direction. These slice encoding gradient blips 314 act to shift the image of every other slice by one-half the imaging field-of-view ("FOV") along the phase encoding direction. Each successive slice-encoding gradient blip 314 is equal in magnitude and opposite in polarity than the preceding blip. In this manner, the slice-encoding gradient blips 314 do not produce phase accumulations in the phase-encoding direction in k-space because each successive blip 314 serves to unwind the phase accrued by the previous blip 314. However, each blip 314 does produce the desired phase shift between adjacent slice location encodings such that a one-half FOV shift is provided in the image domain. To achieve this one-half FOV shift in every other slice location, a relative phase increment of 180 degrees is applied to successive $k_y$ lines by appropriate design of the slice-encoding blips 314 in accordance with Eqn. (2) above. Using this slice-encoding gradient blip scheme, through-plane dephasing is substantially mitigated, thereby providing a significant decrease in pixel tilt and image blurring.

As is known in the art, the foregoing pulse sequence is repeated a plurality of times with a different slice-selective gradient 302 being applied in each repetition such that multiple sets of a plurality of slice locations are sampled.

Gradient Recalled Echo Pulse Sequence with One-Third Field-Of-View Shift

Figure 4A:
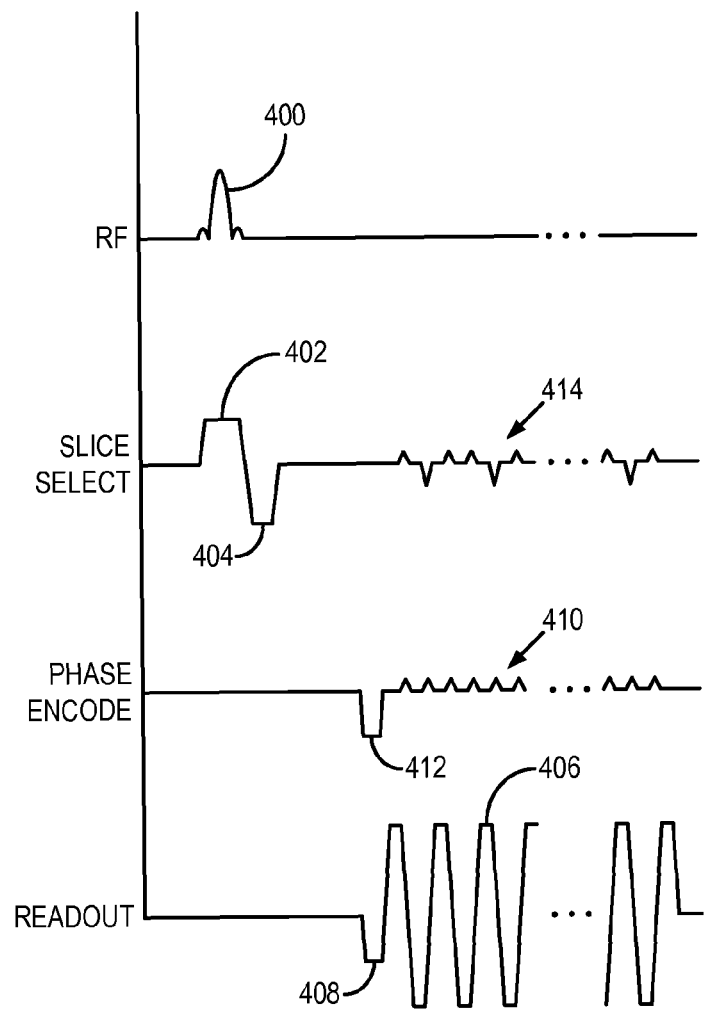
FIG. 4A is a graphic illustration of an exemplary gradient-recalled EPI pulse sequence for directing the MRI system of FIG. 1 to simultaneously acquire image data from multiple slice locations in a subject, such that a one-third field-of-view ("FOV") shift is imparted to MR signals acquired from slice locations adjacent a desired slice location.

The foregoing gradient-recalled EPI pulse sequence can further be modified to provide different FOV shifts in the image domain, such as a one-third FOV shift. An exemplary pulse gradient-recalled echo planar imaging ("EPI") pulse sequence that is modified to acquire image data from multiple slice locations simultaneously while imposing a one-third FOV shift in the image domain is illustrated in FIG. 4A. Like the one-half FOV shifting pulse sequence illustrated in FIG. 3 and discussed above, this pulse sequence includes a spatially selective RF excitation pulse 400 that is played out in the presence of a slice-selective gradient 402 in order to produce transverse magnetization in a plurality of prescribed imaging slices. For example, three slice locations each separated by 4.2 centimeters ("cm") are selectively excited. The RF excitation pulse is the summation of RF excitation pulses that would be used to separately excite the desired plurality of slice locations and is applied with a flip angle, for example, of 70 degrees. The slice-selective gradient 402 includes a rephasing lobe 404 that acts to rephase unwanted phase dispersions introduced by the slice-selective gradient 402 such that signal losses resultant from these phase dispersions are mitigated.

Following excitation of the nuclear spins in the prescribed imaging slices, image data is acquired by sampling a series of gradient-recalled echo signals in the presence of an alternating readout gradient 406. The alternating readout gradient is preceded by the application of a pre-winding gradient 408 that acts to move the first sampling point along the frequency-encoding, or readout, direction by a distance $\Delta k_x$ in k-space. Spatial encoding of the echo signals along a phase-encoding direction is performed by a series of phase encoding gradient "blips" 410, which are each played out in between the successive signals readouts such that each echo signal is separately phase encoded. The phase encoding gradient blips 410 are preceded by the application of a pre-winding gradient 412 that acts to move the first sampling point along the phase-encoding direction a distance $\Delta k_y$ in k-space. Together, the pre-winding gradients 408 and 412 serve to begin the sampling of k-space at a defined k-space location $(k_x, k_y)$.

Figure 4B:
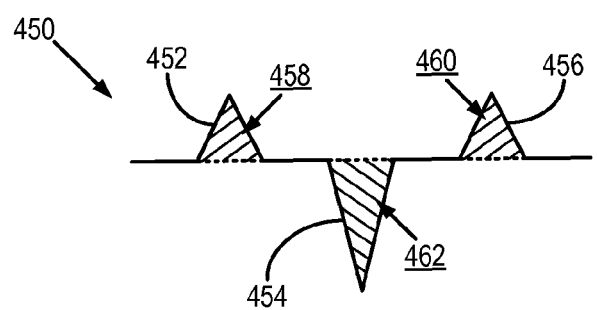
FIG. 4B is a graphic illustration of an exemplary set of slice encoding magnetic field gradient blips employed in the pulse sequence of FIG. 4A to impart a one-third FOV shift in MR signals acquired from slice locations adjacent a desired slice location.

During the application of each phase encoding gradient blip 410, a magnetic field gradient blip is also played out along the slice-encoding direction. These slice encoding gradient blips 414 act to shift the image of every other slice by one-third the FOV along the phase-encoding direction. The slice-encoding blips 414 are applied in sets of three blips. As illustrated in FIG. 4B, each set 450 includes a first slice-encoding blip 452, a second slice-encoding blip 454, and a third slice-encoding blip 456. The duration of each slice-encoding blip, 452, 454, and 456, is equal; however, the magnitude and polarity of the second slice-encoding blip 454 is different than the magnitude and polarity of the first and third slice-encoding blips, 452 and 456, respectively. As a result, the area 458 under the first slice-encoding blip 452 is equal to the area 460 under the third slice-encoding blip 456, whereas the sum of the first and third slice-encoding blip areas 458 and 460 is equal to and opposite in polarity than the area 462 under the second slice-encoding blip 454. In this manner, each set 450 of slice-encoding gradient blips 414 does not produce phase accumulations in the phase-encoding direction in k-space. This is because each set 450 of slice-encoding blips 414 serves to unwind the phase accrued by the previous set 450. However, each set of blips 450 does produce the desired phase shift between adjacent slice location encodings such that a one-third FOV shift is provided in the image domain. Using this slice-encoding gradient blip scheme, through-plane dephasing is substantially mitigated, thereby providing a significant decrease in pixel tilt and image blurring.

As is known in the art, the foregoing pulse sequence is repeated a plurality of times with a different slice-selective gradient 402 being applied in each repetition such that multiple sets of a plurality of slice locations are sampled.

Spin Echo Pulse Sequence with One-Half Field-Of-View Shift

Figure 5:
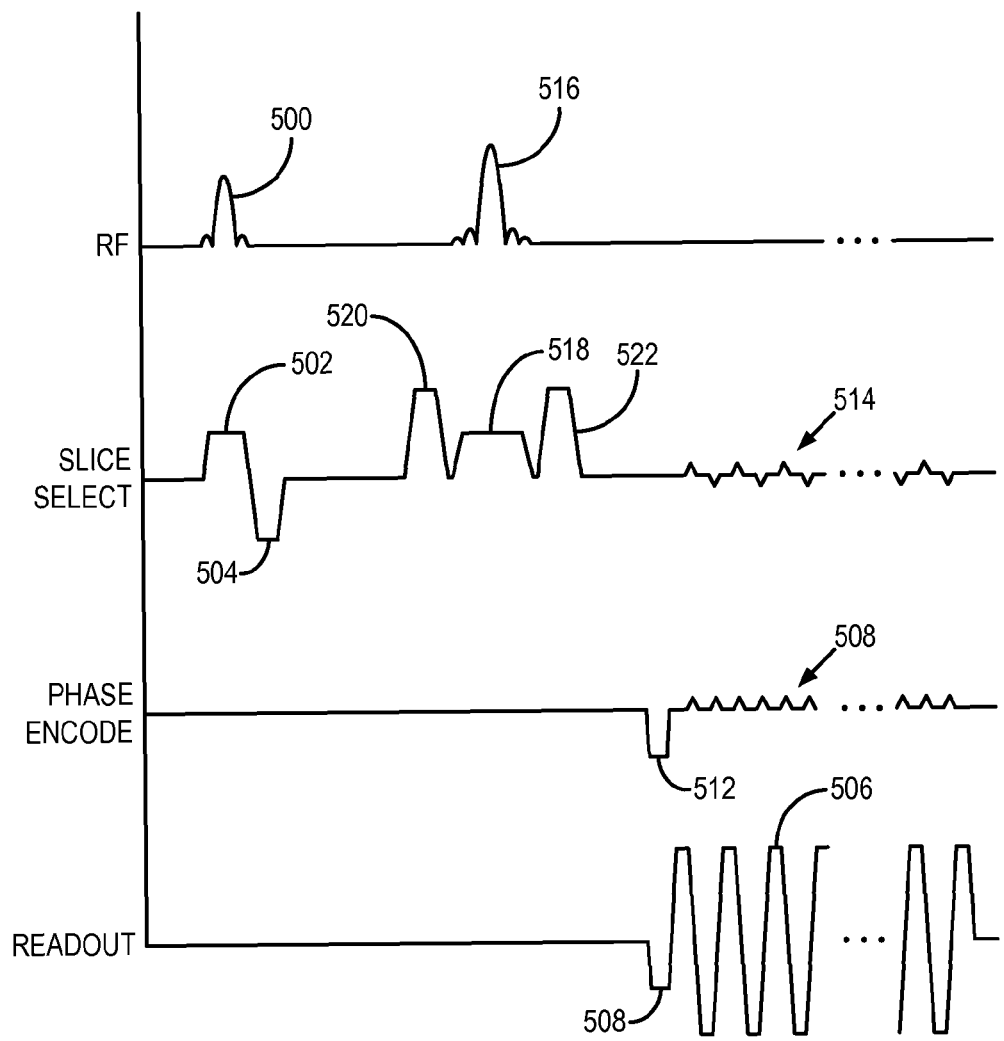
FIG. 5 is a graphic illustration of an exemplary spin echo EPI pulse sequence for directing the MRI system of FIG. 1 to simultaneously acquire image data from multiple slice locations in a subject, such that a one-half field-of-view ("FOV") shift is imparted to MR signals acquired from slice locations adjacent a desired slice location.

Another exemplary pulse sequence employed to direct the MRI system to acquire image data in accordance with the present invention is illustrated in FIG. 5. Such an exemplary pulse sequence is a spin echo EPI pulse sequence that is modified to acquire image data from multiple slice locations simultaneously. The pulse sequence includes a spatially selective RF excitation pulse 500 that is played out in the presence of a slice-selective gradient 502 in order to produce transverse magnetization in a plurality of prescribed imaging slices. For example, three slice locations each separated by 4.2 centimeters ("cm") are selectively excited. The RF excitation pulse is the summation of RF excitation pulses that would be used to separately excite the desired plurality of slice locations and is applied with a flip angle, for example, of 90 degrees. The slice-selective gradient 502 includes a rephasing lobe 504 that acts to rephase unwanted phase dispersions introduced by the slice-selective gradient 502 such that signal losses resultant from these phase dispersions are mitigated.

Following excitation of the nuclear spins in the prescribed imaging slices, a spatially-selective RF refocusing pulse 516 is played out in the presence of another slice-selective gradient 518, such that the nuclear spins excited in the imaging slices are refocused to produce a spin echo. In order to sub-
stantially reduce unwanted phase dispersions, a first crusher gradient 520 bridges the slice-selective gradient 518 with a second crusher gradient 522. Image data is acquired by sampling a series of spin echo signals in the presence of an alternating readout gradient 506. The alternating readout gradient is preceded by the application of a pre-winding gradient 508 that acts to move the first sampling point along the frequency-encoding, or readout, direction by a distance $\Delta k_x$ in k-space. Spatial encoding of the echo signals along a phase-encoding direction is performed by a series of phase encoding gradient "blips" 510, which are each played out in between the successive signals readouts such that each echo signal is separately phase encoded. The phase encoding gradient blips 510 are preceded by the application of a pre-winding gradient 512 that acts to move the first sampling point along the phase-encoding direction a distance $\Delta k_y$ in k-space. Together, the pre-winding gradients 508 and 512 serve to begin the sampling of k-space at a defined k-space location $(k_x, k_y)$.

During the application of each phase encoding gradient blip 510, a magnetic field gradient blip is also played out along the slice-encoding direction. These slice encoding gradient blips 514 act to shift the image of every other slice by one-half the imaging FOV along the phase-encoding direction. Each successive slice-encoding gradient blip 514 is equal in magnitude and opposite in polarity than the preceding blip. In this manner, the slice-encoding gradient blips 514 do not produce phase accumulations in the phase-encoding direction in k-space because each successive blip 514 serves to unwind the phase accrued by the previous blip 514. However, each blip 514 does produce the desired phase shift between adjacent slice location encodings such that a one-half FOV shift is provided in the image domain. Using this slice-encoding gradient blip scheme, through-plane dephasing is substantially mitigated, thereby providing a significant decrease in pixel tilt and image blurring.

As is known in the art, the foregoing pulse sequence is repeated a plurality of times with different slice-selective gradients, 502 and 518, being applied in each repetition such that multiple sets of a plurality of slice locations are sampled.

Diffusion Weighted Pulse Sequence with One-Half Field-Of-View Shift

Figure 6:
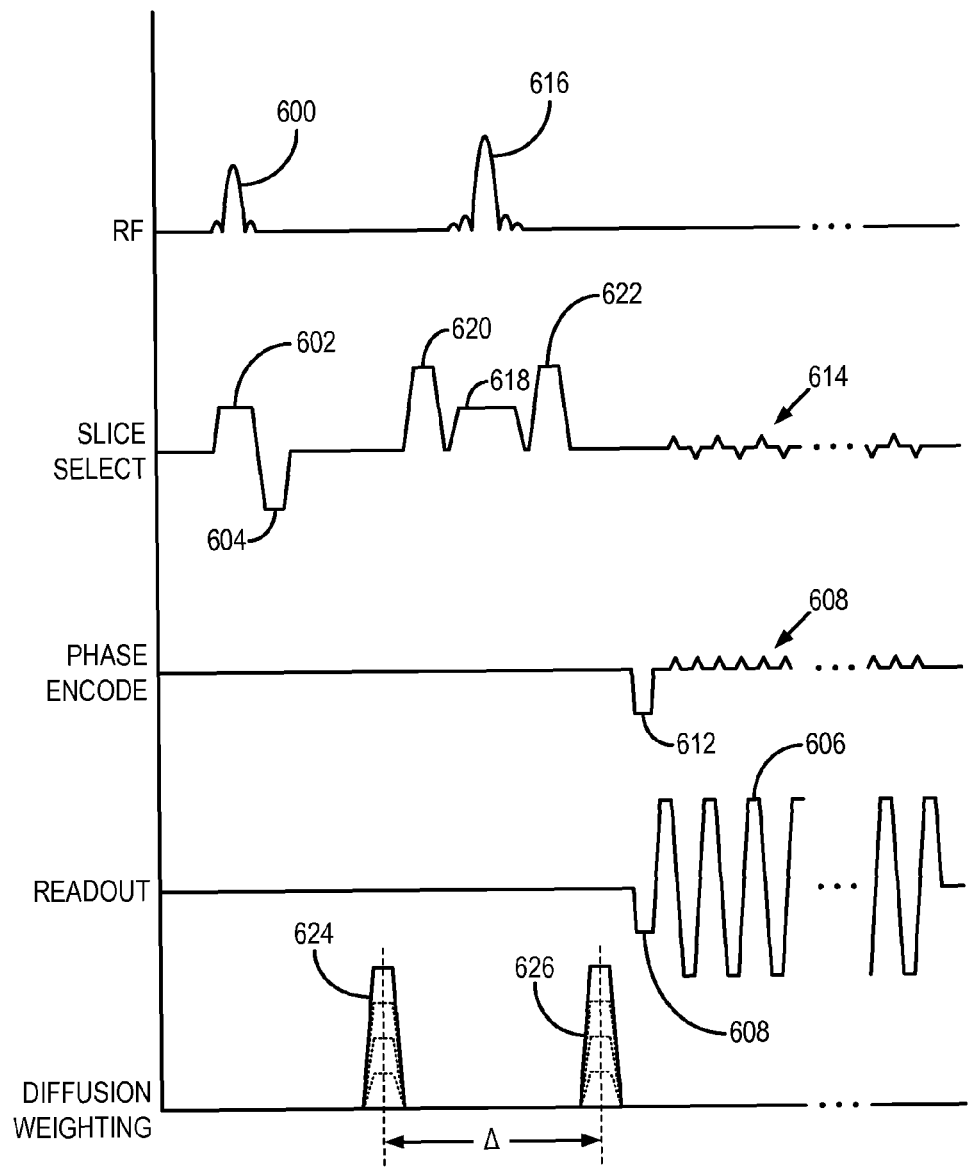
FIG. 6 is a graphic illustration of an exemplary diffusion weighted imaging ("DWI") spin echo EPI pulse sequence for directing the MRI system of FIG. 1 to simultaneously acquire diffusion weighted image data from multiple slice locations in a subject, such that a one-half field-of-view ("FOV") shift is imparted to MR signals acquired from slice locations adjacent a desired slice location.

Another exemplary pulse sequence employed to direct the MRI system to acquire image data in accordance with the present invention is illustrated in FIG. 6. Such an exemplary pulse sequence is a diffusion weighted spin echo EPI pulse sequence that is modified to acquire image data from multiple slice locations simultaneously. The pulse sequence includes a spatially selective RF excitation pulse 600 that is played out in the presence of a slice-selective gradient 602 in order to produce transverse magnetization in a plurality of prescribed imaging slices. For example, three slice locations each separated by 4.2 centimeters ("cm") are selectively excited. The RF excitation pulse is the summation of RF excitation pulses that would be used to separately excite the desired plurality of slice locations and is applied with a flip angle, for example, of 90 degrees. The slice-selective gradient 602 includes a rephasing lobe 604 that acts to rephase unwanted phase dispersions introduced by the slice-selective gradient 602 such that signal losses resultant from these phase dispersions are mitigated.

Following excitation of the nuclear spins in the prescribed imaging slices, a spatially-selective RF refocusing pulse 616 is played out in the presence of another slice-selective gradient 618, such that the nuclear spins excited in the imaging slices are refocused to produce a spin echo. In order to substantially reduce unwanted phase dispersions, a first crusher gradient 620 bridges the slice-selective gradient 618 with a second crusher gradient 622. The slice-selective gradient 618 and crusher gradients 620 and 622 are further bridged by a first and second diffusion weighting gradient, 624 and 626, respectively. These diffusion weighting gradients 624 and 626 are equal in size, that is, their areas are equal. The diffusion weighting gradients 624 and 626, while shown on a separate "diffusion weighting" gradient axis, are in fact produced through the application of diffusion weighting gradient lobes along each of the slice-encoding, phase-encoding, and frequency-encoding gradient directions. By changing the amplitudes and other characteristics of the diffusion weighting gradient lobes, the acquired echo signals can be weighted for diffusion occurring along any arbitrary direction. For example, when the diffusion weighting gradients 624 and 626 are composed solely of gradient lobes applied along the slice-encoding direction, then the acquired echo signals will be weighted for diffusion occurring along the z-direction. For another example, however, if the diffusion weighting gradients 624 and 626 are composed of gradient lobes applied along both the phase-encoding and frequency-encoding directions, then the echo signals will be weighted for diffusion occurring in the x-y plane along a direction defined by the relative amplitudes of the gradient lobe applied in the frequency-encoding direction and in the phase-encoding direction.

Diffusion weighting of the acquired echo signals is provided when spins undergo random Brownian motion, or diffusion, during the time interval, Δ, spanned between the application of the first and second diffusion gradients 624 and 626, respectively. The first diffusion weighted gradient 624 dephases all of the spins in the imaging volume, whereas the second diffusion weighted gradient 626 acts to rephase the same spins by an equal amount. When spins undergo random diffusive motion during this time interval, however, their phases are not properly rephased by the second diffusion gradient 626. This phase difference results in a signal attenuation related to the diffusion occurring along the direction prescribed by the diffusion weighting gradients 624 and 626. The more diffusion that occurs, the more signal attenuation that results.

Image data is acquired by sampling a series of diffusion weighted spin echo signals in the presence of an alternating readout gradient 606. The alternating readout gradient is preceded by the application of a pre-winding gradient 608 that acts to move the first sampling point along the frequency-encoding, or readout, direction by a distance $\Delta k_x$ in k-space. Spatial encoding of the echo signals along a phase-encoding direction is performed by a series of phase encoding gradient "blips" 610, which are each played out in between the successive signals readouts such that each echo signal is separately phase encoded. The phase encoding gradient blips 610 are preceded by the application of a pre-winding gradient 612 that acts to move the first sampling point along the phase-encoding direction a distance $\Delta k_y$ in k-space. Together, the pre-winding gradients 608 and 612 serve to begin the sampling of k-space at a defined k-space location $(k_x, k_y)$.

During the application of each phase encoding gradient blip 610, a magnetic field gradient blip is also played out along the slice-encoding direction. These slice encoding gradient blips 614 act to shift the image of every other slice by one-half the imaging FOV along the phase-encoding direction. Each successive slice-encoding gradient blip 614 is equal in magnitude and opposite in polarity than the preceding blip. In this manner, the slice-encoding gradient blips 614 do not produce phase accumulations in the phase-encoding direction in k-space because each successive blip 614 serves to unwind the phase accrued by the previous blip 614. However, each blip 614 does produce the desired phase shift between adjacent slice location encodings such that a one-half FOV shift is provided in the image domain. Using this slice-encoding gradient blip scheme, through-plane dephasing is substantially mitigated, thereby providing a significant decrease in pixel tilt and image blurring.

As is known in the art, the foregoing pulse sequence is repeated a plurality of times with different diffusion weighting gradients 624 and 626 being applied during each repetition such that a plurality of diffusion weighted image data sets are acquired for each set of imaging slices, each diffusion weighted image data set being weighted by diffusion occurring along the diffusion weighting direction defined by the diffusion weighting gradients 624 and 626. For example, when implementing so-called "diffusion tensor imaging," diffusion encoding is performed along at least six different diffusion encoding directions. On the other hand, when implementing diffusion imaging techniques such as Q-ball imaging ("QBI"), high angular resolution diffusion imaging ("HARDI"), and diffusion spectrum imaging ("DSI"), many more diffusion encoding directions are necessary. For these latter techniques, the number of repetitions of the pulse sequence needed to acquire the desired amount of diffusion weighted image data sets is significantly reduced because image data from multiple slice locations is simultaneously acquired in each repetition of the pulse sequence. After all of the desired diffusion weighted image data sets have been acquired for a given imaging slices, the slice-selective gradients, 602 and 618, are changed and the pulse sequence again repeated a plurality of times in order to acquire a plurality of diffusion weighted image data sets at the new imaging slice locations. This process is repeated until diffusion weighted data has been acquired from all of the desired imaging slice locations.

Exemplary Method for Image Reconstruction

By way of example, when an image is reconstructed from image data simultaneously acquired from n=1 . . . N distinct slice locations, the image will include pixel locations at which signal information is aliased along the slice encoding direction. Thus, the image intensity value for a given pixel location in the reconstructed image includes a superposition of aliased signal information, as illustrated in FIG. 8. The task of "unwrapping" these aliased image pixels can be addressed by the sensitivity encoding ("SENSE") method for image reconstruction, which is described, for example, by K. P. Pruessmann, et al., in "SENSE: Sensitivity Encoding for Fast MRI," *Magn. Reson. Med.,* 1999; 42:952-962.

Figure 7:
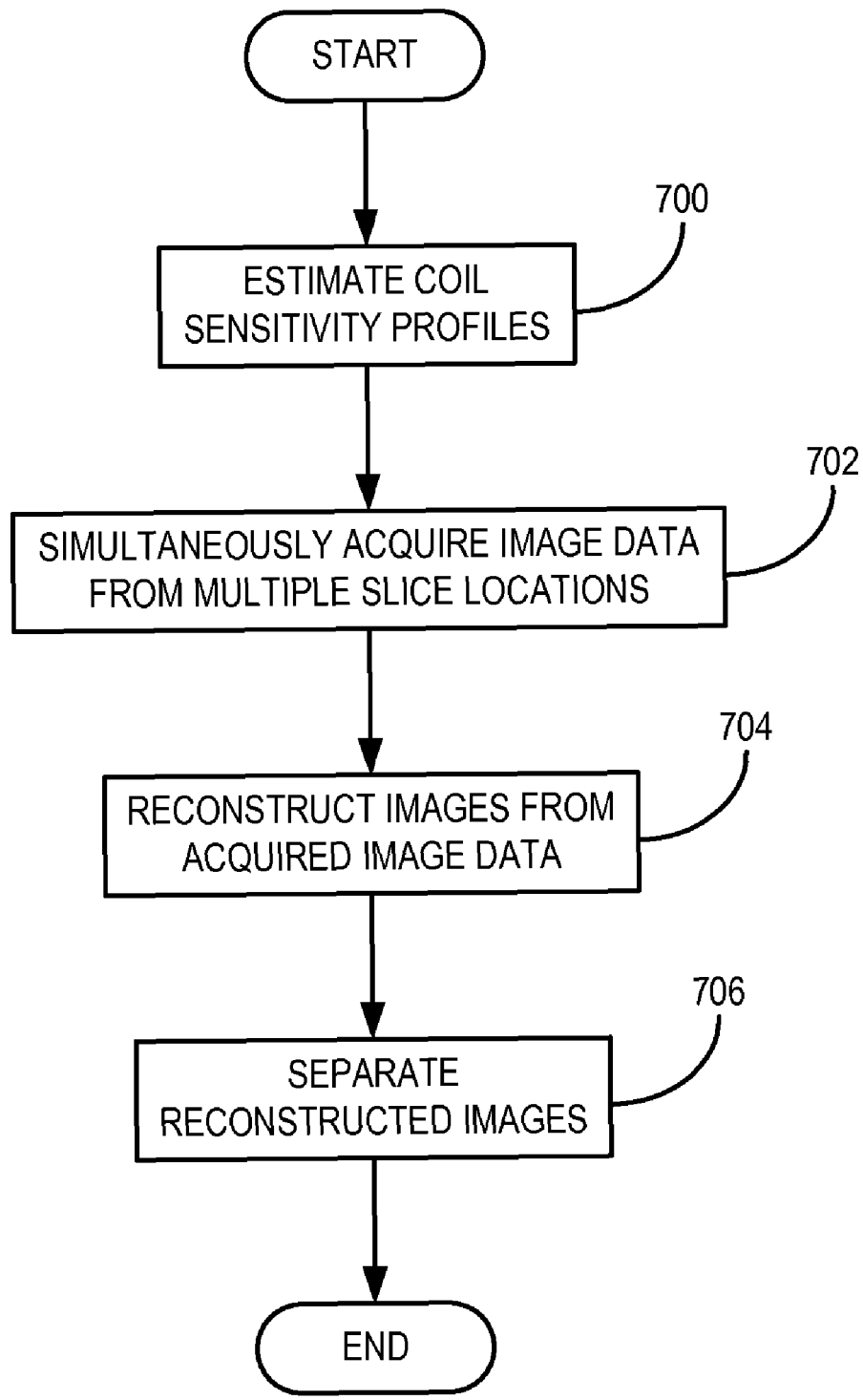
FIG. 7 is a flowchart setting forth the steps of an exemplary method for simultaneously acquiring image data from multiple slice locations in a subject and reconstructing images therefrom.

Referring now to FIG. 7, a flowchart setting forth an exemplary method for reconstructing a plurality of images from image data simultaneously acquired from multiple slice locations is illustrated. The method begins with the estimation of a coil sensitivity profile for each receiver coil in the coil array employed to detect echo signals from the subject, as indicated at step 700. It will be appreciated by those skilled in the art that in some instances such coil sensitivity profiles may already be estimated prior to the performance of this method, in which instance step 700 need not be performed. Next, the image data is simultaneously acquired from multiple slice locations in a subject, as indicated at step 702. This data acquisition is performed by directing the MRI system with a pulse sequence such as one of the pulse sequences described above and illustrated in one of FIGS. 3-6. It will be appreciated by those skilled in the art, however, that other variations of the foregoing pulse sequences can be implemented and are within the scope of the present invention. As described above, each acquired image data set includes signal information corresponding to a plurality of slice locations.

Figure 8A:
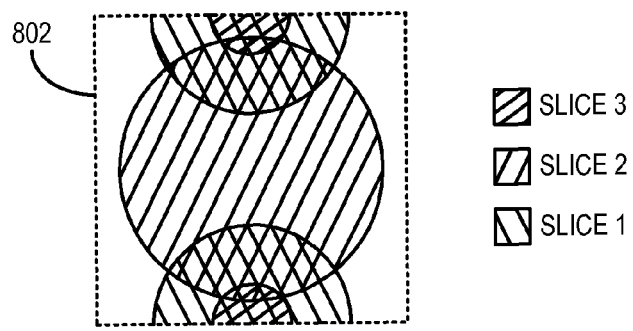
FIG. 8A is a graphic representation of an exemplary aliased image reconstructed using conventional image reconstruction techniques from image data acquired simultaneously from multiple slice locations.
Figure 8B:
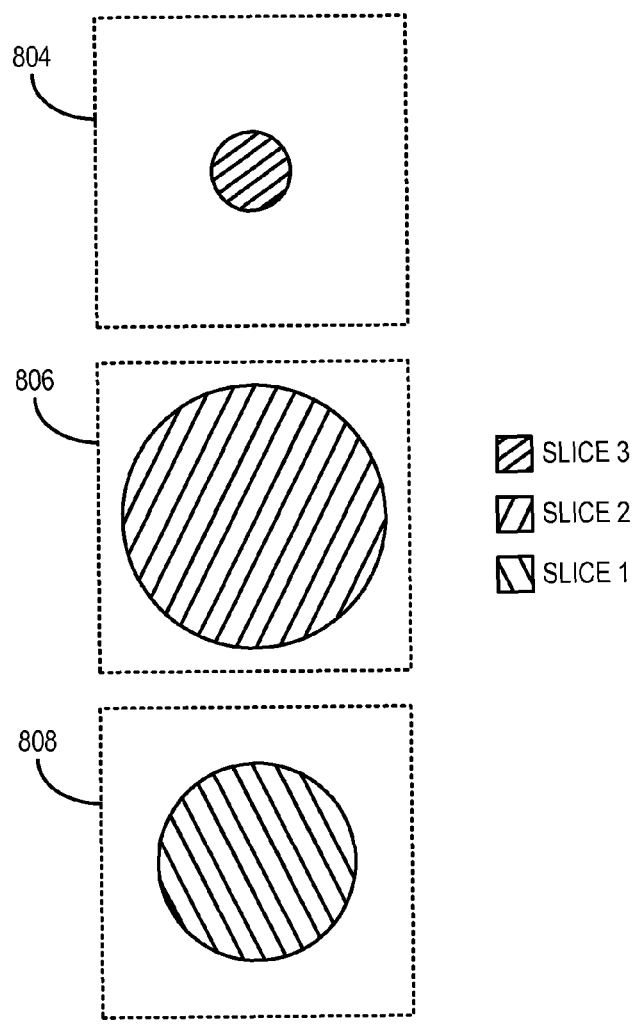
FIG. 8B is a graphic representation of three exemplary images reconstructed in accordance with the present invention from image data acquired simultaneously from multiple slice locations.

Subsequently, an image is reconstructed from each image data set, as indicated at step 704. Since the image data sets include signal information from multiple slice locations that has been shifted by a percentage of the imaging FOV, these reconstructed images include aliasing along the slice-encoding direction. As illustrated in FIG. 8A, this aliasing is exhibited as the superposition of images from the different slice locations in the same image 802, as shifted by the percentage of the FOV. Each reconstructed image is then processed using the estimated coil sensitivity profiles in order to separate the aliased signal information in order to produce a plurality of separated images of the subject, as indicated at step 706. By way of example, this separation is accomplished using the SENSE technique described above; however, other image domain based parallel reconstruction methods can similarly be employed. As illustrated in FIG. 8B, following this separation distinct images, 804, 806, and 808, corresponding to distinct image slice locations are produced.

Another exemplary method for reconstructing a plurality of images from image data simultaneously acquired from multiple slice locations utilizes a modified GRAPPA reconstruction method, such as the one described by M. Blaimer, et al., in "Accelerated Volumetric MRI with a SENSE/GRAPPA Combination," *J. Magn. Reson. Imaging,* 2006; 24:444-450. Thus, by way of example, separation is also achievable using such a modified GRAPPA.

It should be apparent that the method of the present invention can be readily adapted to provide percentage of FOV shifts other than those expressly disclosed herein. The percentage of FOV to be shifted is selected while taking into consideration several factors including the number of slice locations simultaneously acquired, the separation distance of the slice locations, and the in-plane and longitudinal variation of the sensitivity of the RF coil employed to acquire the signal data. Again, this selection is made in order to achieve a substantially optimal separation between aliased pixels so that SNR losses are mitigated.

By way of example, when there is substantially no variation in the spatial sensitivity of the RF coil array along the slice-encoding direction, but there is significant variation in the in-plane sensitivity, then for the simultaneous excitation of N slice locations, it is desirable to impart a 1/N FOV shift to each sequentially adjacent slice location. Thus, in this example, for two slice locations, a one-half FOV shift is desired. Similarly, for three slice locations, a one-third FOV shift is desired.

By way of further example, when there is significant variation in the spatial sensitivity of the RF coil array along the slice-encoding direction, but no in-plane, then shifting the FOV provides substantially little benefit. This result is because the lack of in-plane variation reduces the amount of information available to separate aliased signals that are shifted by a percentage of the FOV in-plane. However, since there is significant variation along the slice-encoding direction in this instance, the aliased signals can still be properly separated.

By way of further example, when there is a combination of RF coil sensitivity variations along the slice-encoding direction and in-plane, consideration of the percentage of FOV shift to employ relies on trading-off separation of aliased signals in the in the plane transverse to the slice-encoding direction versus separation of the aliased signals in the slice-encoding direction with the aim to minimize SNR losses. For example, when signal data is simultaneously acquired from a large number of slice locations, aliased pixel locations will not be separated very well in-plane if a small FOV shift, such as one-tenth, is implemented. Therefore, a larger FOV shift, such as one-fifth, may be desirable. The spatial variation of the RF coil array sensitivity profile is then utilized to provide sufficient information to separate the aliased pixel locations. By increasing the size of the FOV shift, SNR losses resulting from the in-plane proximity of aliased signals are mitigated. It should be apparent to those skilled in the art that the foregoing examples can be further modified when considering the separation distance between adjacent slice locations. As the separation distance increases, the distance between aliased pixels also increases. This factor can be further relied upon to provide information useful for separating the aliased pixels, while further mitigating SNR losses.

The present invention has been described in terms of one or more preferred embodiments, and it should be appreciated that many equivalents, alternatives, variations, and modifications, aside from those expressly stated, are possible and within the scope of the invention. For example, the present invention is readily applicable to other echo planar imaging techniques aside from those expressly described above, such as radial echo planar imaging techniques, in which an additional alternating readout gradient is employed in lieu of a phase encoding gradient in order to sample k-space along a plurality of radial trajectories that extend outward from the center of k-space. Similarly, so-called spiral echo planar imaging techniques can also be employed when practicing the present invention.

The invention claimed is:

1. A method for producing a plurality of images of a subject with a magnetic resonance imaging (MRI) system, the steps of the method comprising:
  a) applying, with the MRI system, a radio frequency (RF) excitation field to a portion of a subject that includes a plurality of slice locations, the plurality of slice locations including a current slice location and at least one adjacent slice location;
  b) establishing, with the MRI system, at least one readout magnetic field gradient along a frequency-encoding direction following the application of the RF excitation field in order to form echo signals;
  c) sequentially producing a plurality of slice-encoding magnetic field gradient blips along a slice-encoding direction while the at least one readout magnetic field gradient is established in order to impart a phase shift to the formed echo signals such that image data corresponding to the at least one adjacent slice location is shifted by a selected percentage of a field-of-view (FOV) of the current slice location;
  d) acquiring, with an array of RF receiver coils that forms a part of the MRI system, image data indicative of the formed echo signals; and
  e) reconstructing a plurality of images of the subject from the acquired image data, each of the plurality of images depicting the subject at a corresponding one of the plurality of slice locations.

2. The method as recited in claim 1 in which the percentage of the FOV is selected based on information related to a spatial sensitivity of the array of RF receiver coils along the slice-encoding direction, a spatial sensitivity of the array of RF receiver coils in a plane transverse to the slice-encoding direction, a separation distance between the plurality of slice locations, and a number of the plurality of slice locations.

3. The method as recited in claim 1 in which the at least one adjacent slice location includes a first adjacent slice location adjacent the current slice location and a second adjacent slice location adjacent the first adjacent slice location, and the phase shift imparted to the formed echo signals shifts the first adjacent slice location by the selected percentage of the FOV and second adjacent slice location by twice the selected percentage of the FOV.

4. The method as recited in claim 1 in which the plurality of slice locations include N slice locations, and the selected percentage of the FOV is 1/N.

5. The method as recited in claim 1 in which a polarity of each of the plurality of slice-encoding magnetic field gradient blips is alternated as the plurality of slice-encoding magnetic field gradient blips are sequentially produced.

6. The method as recited in claim 5 in which each of the plurality of slice-encoding magnetic field gradient blips has a same magnitude.

7. The method as recited in claim 5 in which the phase shift imparted to the formed echo signals results in shifting image data corresponding to the at least one adjacent slice location by one-half of the FOV of the current slice location.

8. The method as recited in claim 1 further comprising estimating a sensitivity map for each RF receiver coil in the array of RF receiver coils.

9. The method as recited in claim 8 in which step c) further includes reconstructing the plurality of images using the estimated sensitivity maps.

10. The method as recited in claim 1 further comprising applying at least two diffusion encoding magnetic field gradients prior to establishing the at least one readout magnetic field gradient in order to encode the echo signals for diffusion occurring along a selected diffusion encoding direction.

11. A method for directing a magnetic resonance imaging (MRI) system to sample k-space, the steps of the method comprising:
   a) applying a radio frequency pulse in the presence of a spatially selective magnetic field gradient pulse, such that transverse magnetization is established in a spatial region including at least two slice locations;
   b) applying an alternating readout magnetic field gradient along a frequency encoding direction, such that a plurality of echo signals are formed;
   c) repeatedly applying a set of slice encoding magnetic field gradient blips that includes at least two slice encoding magnetic field gradient blips having opposite polarity, the set of slice encoding magnetic field gradient blips having a zero time integral; and
   d) acquiring k-space data from the plurality of formed echo signals using an array of RF receiver coils.

12. The method as recited in claim 11 in which the set of slice encoding magnetic field gradient blips includes two magnetic field gradient blips having a same magnitude but opposite polarity.

13. The method as recited in claim 11 in which the set of slice encoding magnetic field gradient blips includes:
   a first magnetic field gradient blip having a magnitude and polarity;
   a second magnetic field gradient blip having another magnitude and another polarity that is opposite the polarity of the first magnetic field gradient blip; and
   a third magnetic field gradient blip having the magnitude and the polarity of the first magnetic field gradient blip.

14. The method as recited in claim 11 further comprising applying a phase encoding magnetic field gradient substantially contemporaneously with the repeatedly applied set of slice encoding magnetic field gradient blips such that the plurality of echo signals are spatially encoded along a phase-encode direction.

15. The method as recited in claim 14 in which the phase encoding magnetic field gradient includes a plurality of phase encoding magnetic field gradient blips, each of the plurality of phase encoding magnetic field gradient blips being played out substantially contemporaneously with a respective slice encoding magnetic field gradient blip.

16. The method as recited in claim 11 further comprising reconstructing at least two images from the acquired k-space data, each of the at least two images depicting a respective one of the at least two slice locations.

17. The method as recited in claim 16 further comprising estimating a sensitivity map for each RF receiver coil in the array of RF receiver coils and using the estimated sensitivity maps when reconstructing the at least two images.

18. The method as recited in claim 11 in which step b) further includes applying at least two diffusion encoding magnetic field gradients prior to applying the alternating readout magnetic field gradient in order to encode the plurality of echo signals for diffusion occurring along a selected diffusion encoding direction.

19. The method as recited in claim 18 in which steps a)-c) are repeated a selected number of times, and during each repetition a different at least two diffusion encoding magnetic field gradients are applied such that the plurality of echo signals acquired during the repetition are encoded for diffusion occurring along a different diffusion encoding direction.

20. The method as recited in claim 19 in which the selected number of times is at least six.

* * * * *